United States Patent
Helvey

(10) Patent No.: US 8,949,755 B2
(45) Date of Patent: Feb. 3, 2015

(54) ANALYZING SPARSE WIRING AREAS OF AN INTEGRATED CIRCUIT DESIGN

(71) Applicant: International Business Machines Corporation, Armonk, NY (US)

(72) Inventor: Timothy D. Helvey, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/887,487

(22) Filed: May 6, 2013

(65) Prior Publication Data

US 2014/0331196 A1 Nov. 6, 2014

(51) Int. Cl.
*G06F 17/50* (2006.01)

(52) U.S. Cl.
CPC .................................. *G06F 17/5077* (2013.01)
USPC ........... 716/111; 716/103; 716/108; 716/113; 716/126; 716/132; 716/136

(58) Field of Classification Search
CPC .......................... G06F 17/5077; G06F 17/5072
USPC ................... 716/103, 108, 111, 113, 126, 136
See application file for complete search history.

(56) References Cited

U.S. PATENT DOCUMENTS

| | | | | |
|---|---|---|---|---|
| 5,607,341 | A * | 3/1997 | Leach | 451/41 |
| 5,682,107 | A * | 10/1997 | Tavana et al. | 326/41 |
| 5,702,290 | A * | 12/1997 | Leach | 451/41 |
| 5,883,525 | A * | 3/1999 | Tavana et al. | 326/39 |
| 6,272,668 | B1 | 8/2001 | Teene | |
| 6,415,426 | B1 | 7/2002 | Chang et al. | |
| 7,062,743 | B2 * | 6/2006 | Kahng et al. | 716/122 |
| 7,111,268 | B1 | 9/2006 | Anderson et al. | |
| 7,222,311 | B2 | 5/2007 | Kaufman et al. | |
| 7,308,664 | B1 | 12/2007 | Fung et al. | |
| 7,389,485 | B1 | 6/2008 | Rahut et al. | |
| 7,428,721 | B2 * | 9/2008 | Rohe et al. | 716/138 |
| 7,594,204 | B1 | 9/2009 | Singh et al. | |
| 7,900,182 | B2 | 3/2011 | Drumm et al. | |
| 7,902,866 | B1 * | 3/2011 | Patterson et al. | 326/41 |
| 8,176,454 | B2 * | 5/2012 | Potkonjak | 716/108 |
| 8,413,104 | B2 * | 4/2013 | Ellavsky et al. | 716/139 |
| 8,554,972 | B2 * | 10/2013 | Koch et al. | 710/305 |
| 8,631,370 | B2 * | 1/2014 | Benjamin et al. | 716/113 |
| 8,689,170 | B2 * | 4/2014 | Ellavsky et al. | 716/139 |
| 2007/0028201 | A1 * | 2/2007 | Mehrotra et al. | 716/12 |
| 2009/0064068 | A1 * | 3/2009 | Ng et al. | 716/6 |
| 2009/0070726 | A1 * | 3/2009 | Mehrotra et al. | 716/13 |
| 2010/0257498 | A1 | 10/2010 | Alpert et al. | |

(Continued)

OTHER PUBLICATIONS

Y. Kleinman, Dr. J. Schelly, C.R. Selinger; "Time Based Net Typing for Optimized System Timing;" IP.com; IP.com No. IPCOM000109621D; Sep. 1, 1992 original publication date; vol. 35, No. 4A., pp. 360-362; Mar. 24, 2005 IP.com electronic publication date.

(Continued)

*Primary Examiner* — Helen Rossoshek
(74) *Attorney, Agent, or Firm* — Richard A. Wilhelm; James R. Nock

(57) ABSTRACT

A set of nets in an integrated circuit design, having a timing margin and traverse routing tiles, are identified. The set of nets are assigned a utilization metric based on the traversed routing tiles. A set of sparse nets are determined from the set of nets, based on the utilization metric of each net in the set of sparse nets. One or more target nets are selected from the set of sparse nets, based on the timing margin of the target nets. The target nets may be modified.

20 Claims, 7 Drawing Sheets

(56) References Cited

U.S. PATENT DOCUMENTS

2012/0290995 A1* 11/2012 Ellavsky et al. .............. 716/119
2013/0174114 A1* 7/2013 Ellavsky et al. .............. 716/122
2013/0290921 A1* 10/2013 Benjamin et al. ............. 716/123
2013/0305197 A1* 11/2013 Baumgartner et al. ....... 716/103

OTHER PUBLICATIONS

D.P. Lapotin, C.R. Selinger, M.L. White; "Capacitance Based Net Typing for Wirability;" IP.com; IP.com No. IPCOM000109618D; Sep. 1, 1992 original publication date; vol. 35, No. 4A, pp. 352-353; Mar. 24, 2005 IP.com electronic publication date.

Haoxing Ren, David Z. Pan, David S. Kung, "Sensitivity Guided Net Weighting for Placement-Driven Synthesis;" IEE Transactions on Computer-Aided Design of Integrated Circuits and Systems, vol. 24, No. 5, pp. 711-721; May 2005.

Mandalagiri S. Chandrasekhar, Robert H. McCharles, David E. Wallace; "Effective Coupling between Logic Synthesis and Layout Tools for Synthesis of Area and Speed-Efficient Circuits;" VLSI Design, 1997, vol. 5, No. 22, pp. 125-140; Amsterdam B.V. Published under licensure by Gordon and Breach Science Publishers; Malaysia.

\* cited by examiner

ANALYZING SPARSE WIRING AREAS OF AN INTEGRATED CIRCUIT DESIGN

FIELD OF INVENTION

The present invention relates generally to integrated circuits, and more specifically, regards improving utilization of available resources in order to build in more timing margin without affecting the routability of the design.

BACKGROUND

Routing is an important step in the design of an integrated circuit. It generates wiring to interconnect pins while obeying the manufacturing design rules. After placement, the routing process determines the precise paths for nets on the chip layout to interconnect the pins on the circuit blocks. The most important objective of routing is to complete all the required connections. Other objectives, such as reducing the routing wire length and ensuring each net satisfies its required timing budget, have become essential for modern integrated circuit design. For many years, signal propagation delay in logic gates was the main contributor to circuit delay, while propagation delay in the wires was negligible. However, technology scaling has significantly increased the relative impact of propagation delay due to the wiring of an integrated circuit. This has increased the likelihood that a signal will not satisfy timing requirements and has also increased the probability of chip failure.

SUMMARY

Disclosed herein are embodiments of a method for analyzing an integrated circuit design arranged into a grid of routing tiles. In an embodiment, a method includes an operation where a set of nets in the integrated circuit design, each net having a timing margin and each net traversing at least one routing tile are identified. In addition, the method may include an operation where a utilization metric, based on the traversed routing tiles, is assigned to each net. Also, the method may include an operation where a set of sparse nets are determined from the set of nets based on the utilization metric of each net in the set of sparse nets. Furthermore, the method may include an operation where one or more target nets from the set of sparse nets is selected, based on the timing margin of the target nets. In an embodiment, the target nets may then be modified.

Also disclosed herein are embodiments of a system for analyzing an integrated circuit design arranged into a grid of routing tiles. In an embodiment, a system includes a netlist adapted to store a timing margin, a wire code, and a routing description for each net in a set of nets associated with the integrated circuit design that identifies at least one traversed routing tile. In addition, the system may include a utilization metric generator adapted to assign a utilization metric to each net in the set of nets, based on the traversed routing tiles. Also, the system may include a sparse net list generator adapted to determine a set of sparse nets from the set of nets based on the utilization metric of each net in the set of sparse nets. Furthermore, the system may include a target net list generator adapted to select one or more target nets from the set of sparse nets, based on the timing margin of the target nets.

Also disclosed herein are embodiments of a computer-readable storage medium encoded with instructions for analyzing an integrated circuit design arranged into a grid of routing tiles. In an embodiment, a computer-readable storage medium includes instructions for identifying a set of nets in an integrated circuit design, each net having a timing margin and each net traversing at least one tile. In addition, the computer-readable storage medium may include instructions for assigning each net in the set of nets, a utilization metric, based on the traversed routing tiles. Also, the computer-readable storage medium may include instructions for determining a set of sparse nets from the set of nets based on the utilization metric of each net in the set of sparse nets. Furthermore, the computer-readable storage medium may include instructions for selecting one or more target nets from the set of sparse nets, based on the timing-margin of the target net.

DETAILED DESCRIPTION

Figure 1A:
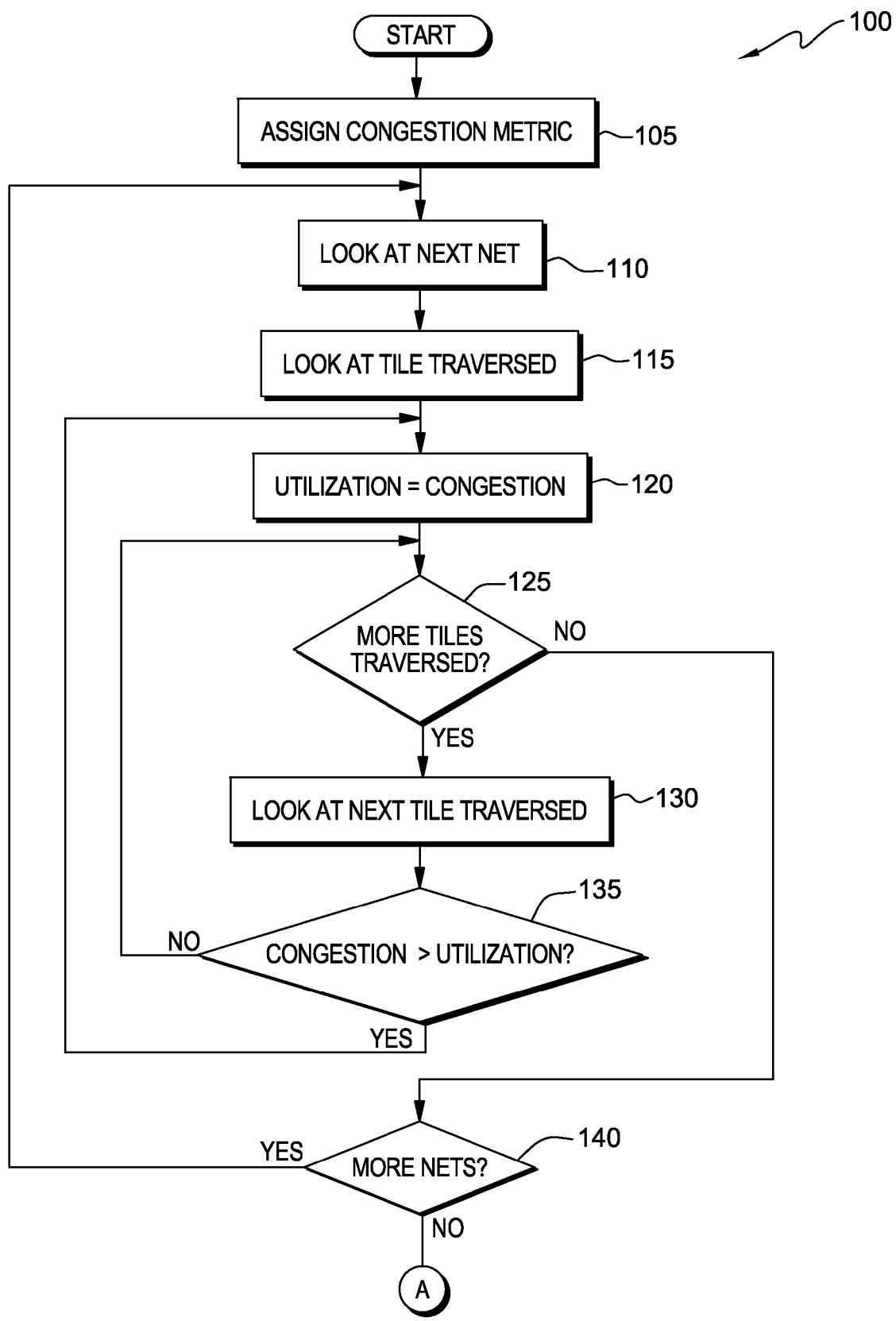
FIG. 1A is a portion of a flow diagram illustrating an example embodiment of a method for utilizing available wiring resources in sparse wiring areas of an integrated circuit design.

The proliferation of modern electronics is due in large part to the development of the integrated circuit. Integrated circuits allow many different circuit elements to be implemented on a single microchip. As technology advances, the number of circuit elements on a microchip continues to increase, which enhances the performance and reduces the cost of integrated circuits.

Routing in an integrated circuit is typically a very complex process. After placement, an integrated circuit contains the information about the locations of blocks and pins of blocks. The integrated circuit design also has a netlist that describes a list of connections by indicating which pins should be connected to form a set of nets. For modern large-scale circuit design, a chip may contain billions of transistors and millions of nets. To handle the high complexity, a routing algorithm often adopts the two-stage approach of global routing followed by detailed routing.

Global routing first partitions the integrated circuit into global routing tiles and determines tile-to-tile paths for all nets while attempting to optimize some given objective such as wire length or circuit timing. In other words, in global routing, a 'loose' route for each net is generated where a list of routing regions is assigned to each net without specifying the actual layout of the wires. Global routing can be further sub-divided into two categories: (1) sequential global routing and (2) concurrent global routing.

Sequential global routing entails selecting a specific net order and routing each net in that order. This approach puts a lot of pressure on the ordering of the nets because a routed net might block the routing of a subsequent net. To get around this limitation, sequential routing also involves the process of rip-up and reroute, where the nets in regions that are blocking other nets are ripped up, the blocked nets are routed and the ripped up nets are rerouted. The process continues until all nets are routed and can generally lead to more desirable solutions.

Concurrent global routing also confronts the net-ordering problem encountered during sequential global routing. In concurrent global routing, the integrated circuit design is partitioned into global routing tiles and each global routing tile is assigned a net capacity, herein called a congestion metric, which denotes the amount of wires that cross the routing tile boundary. With this limitation and the limitations of other factors such as shortest path and wire length, the possible routing pattern for each net are determined and an overall routing layout is determined that minimizes the congestion metric.

After global routing is performed, detailed routing takes place. In detailed routing, the actual tracks and vias for nets are determined. A via is an electrical connection between layers in an integrated circuit that allows a single net to traverse three-dimensional space of the integrated circuit. Two of the most common types of detailed routing are: (1) channel routing and (2) switchbox routing.

In channel routing, a routing region is decomposed into routing channels and wires are connected within the routing channels. A channel is a horizontal routing area with fixed pins on the top and bottom. There are no pins to the right or left, but certain nets may be designated as route-to-the-edge, therefore, there may be "floating pins" to the right or left. Each pin is designated by a number and all pins with the same number must be routed together forming a net. Pins with different numbers must be electrically isolated from one another. The input to a channel routing problem is two sets of numbers, one that gives the pin numbers at the top of the channel and the other that gives the pin numbers at the bottom of the channel. A pin number of zero designates an empty pin that is never connected to anything. Channels are routed in two layers, one layer for horizontal wires, one layer for the vertical wires and the two layers are insulated from one another. Through the use of trunks (horizontal wires) and branches (vertical wires) the pin at the top of the channel is connected to the pin at the bottom. Furthermore, through the use of doglegs, where the routing path of a net contains more than one trunk, channel height can be minimized, which is directly related to the size of an integrated circuit chip and, therefore, manufacturing cost.

As opposed to channel routing, switchbox routing has boundaries on all four sides and all boundaries need to be considered while routing. The terminals are located on the four boundaries of the routing region. Each terminal is related to a net. Each net specifies the terminals on the four boundaries that are connected together, in other words, all the terminals that have the same net number are connected. The set of nets specifying the entire connectivity of the terminals is called the netlist. In switchbox routing, the wires are allowed to run either horizontally or vertically. Only a single wire is allowed to occupy each row and column segment and crossover of two wires is allowed.

For global and detailed routing, there are several general-purpose routing algorithms that can be used. These general-purpose routing algorithms can also be categorized into 2-pin net routing or multiple-pin net routing. For 2-pin net routing we will discuss the maze routing algorithm, the line-search routing algorithm, and the A*-search routing algorithm. For multiple-pin net routing we will discuss the Steiner tree algorithm.

The maze-routing algorithm is perhaps the most widely used algorithm for finding a path between two points. Maze routing uses the two-phase approach of filling and retracing. The filling phase follows the "wave propagation" process. Starting from the source tile, the adjacent routing tiles are labeled according to the distance from the source tile until the target tile is reached. Once the target tile is reached, a shortest path is retraced from the target tile to the source tile with decreasing labels traversed by the wire.

The line-search algorithm initially sets the source and the target as base points and then generates two horizontal and two vertical perpendicular line segments passing through the base points. These line segments are extended until they hit the design boundary or obstacles. Then, each grid point of these line segments at level i are iteratively set as new base points and perpendicular line segments of level i+1 are generated crossing each new base point. This process repeats until a segment generated from the source intersects a segment generated from the target and a connection can then be found by tracing from its intersection point to both the source and target.

The A*-search algorithm uses the function $f(x)=g(x)+h(x)$ to evaluate the cost of a path, where $g(x)$ is the cost from the source tile to the current tile x, and $h(x)$ is the estimated cost from the current tile to the target tile. After a new current tile is reached, the algorithm selects a new tile with the lowest path cost to propagate towards until the target tile is reached.

For multiple-pin nets, the previous algorithms do not lend themselves well to connecting the pins with wires of shortest possible length. A better and more natural method to route multiple-pin nets is to adopt the Steiner-tree based approach. In this approach there are N points in the plane and the goal is to connect them by wires of minimum total length in such a way that any two points may be connected by line segments either directly or via other points and line segments. After all N points are connected with one wire segment; the algorithm selects points, called Steiner points, which connect directly with one point and directly with another point by a separate wire. The selection of the Steiner points greatly reduces the total wire length and more Steiner points are selected until the wire length can no longer be improved.

For an integrated circuit to work correctly and avoid a glitch, signals must satisfy timing requirements. In a synchronous digital system, data is supposed to move in lockstep, advancing one stage on each tick of the clock signal. A clock plays important roles as it is used to open and close digital paths, allow or stop a process and provide timing for the circuit in general. A clock can be compared to traffic lights, they stop and allow the traffic in a timely manner so that traffic can flow smoothly with the least delays. Clocks are especially used to avoid glitches in a circuit. A glitch is an unpredictable output. If there is an input and for that input there is a known output, but before the output settles to what is expected, there are unexpected transitions, a glitch has occurred. These occur because the inputs have to go through different gates and the propagation delay of each can be different and the signals arrive to the final gates at different times. This difference in data arrival results in changes in the output until all signals settle and the output is valid. If glitches are not eliminated, they will go to the next stage of the circuit and generate more unpredictable results. To avoid them, a clock can be used to time signals. For instance, the inputs to the circuit are provided with one rising edge of the clock and the output of the circuit is read by the next rising edge of the clock. If the period of the clock signal is higher than the total propagation delay of the circuit, the output will be read when it is completely settled and therefore no glitch happens. Furthermore, a clock with a higher speed will allow for a faster process. However, a clock has to wait for all the data to be ready before it passes them forward. This means that the circuit delay becomes a very important factor. If the circuit delay is long, the clock has to be slow to allow enough time for the data to arrive. Therefore, increasing the clock frequency is only possible if the circuit delay decreases.

The main purpose of timing analysis is to verify that there will not be a hold time violation, where a signal arrives too early and advances one clock cycle before it should, or a setup time violation, where a signal arrives too late and misses the time when it should advance. When considering timing requirements there are a few key terms that must be discussed.

The critical path is defined as the path between an input and an output with the maximum delay. Once the circuit timing has been computed, the critical path can easily be found by using a traceback method.

The arrival time of a signal is the time elapsed for a signal to arrive at a certain point. The reference, or time 0.0, is often taken as the arrival time of a clock signal. To calculate the arrival time, delay calculation of all the components of the path will be required. Arrival times and almost all times in timing analysis are normally kept as a pair of values, the earliest possible time at which a signal can change and the latest possible time at which a signal can change.

Required time is the latest time at which a signal can arrive without making the clock cycle longer than desired. Slack time, associated with each connection, is the difference between the required time and the arrival time. A positive slack of x implies that the arrival time may be increased by x without affecting the overall delay of the circuit. Conversely, negative slack time implies that a path is too slow and the path must speed up if the whole circuit is to work at the desired speed.

Routing is pivotal to designing integrated circuits with logical elements. For a long time it was assumed in the design of logical networks that the circuit delay depends only on the time for executing operations in the logical elements. Since the advent of circuits with elements smaller than one micron, the delay of data transmission between the elements became the major component of the total delay. Furthermore, current routing algorithms and timing optimization algorithms are generally tuned to optimize the timing slack on the paths such that it meets a specified threshold while also not causing routing congestion to exceed acceptable thresholds. This tends to create a slack "wall" where many timing paths have margin right at the specified threshold. This may limit the ability to do later optimizations for power reduction and may cause some paths to have negative slack if the routing is non-optimal. Therefore, a need exists in the art for a process that can increase the arrival times, thus increasing the slack times, along paths in an integrated circuit design by utilizing available wiring resources in sparse wiring areas of the design.

In this detailed description, reference is made to the accompanying drawings, which illustrate example embodiments. It is to be understood that other embodiments may be utilized and structural changes may be made without departing from the scope of the invention.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Flow diagram 100 in FIG. 1A is a portion of a flow diagram illustrating an example embodiment of a method for utilizing available wiring resources in sparse wiring areas of an integrated circuit design. At step 105, a congestion metric is assigned to each routing tile in the integrated circuit design. Any commercial routing tool that uses an algorithm that assigns a congestion metric may be used, and many commercial routing tools are available. During the routing process the algorithm may determine the congestion metric for each tile. The congestion metric is a metric that describes the density of the nets that traverse each routing tile. There are several ways the algorithm can determine the congestion metric for a routing tile, some examples include literal count method, adhesion method, fanout method, net range method, and neighborhood population method. After the congestion metric is determined for each routing tile, the routing tiles are assigned their respective congestion metric 105.

In this example, the method assigns a utilization metric to each net. An integrated circuit design contains a set of nets in the design. At step 110, the method looks at a net in the integrated circuit design. In this example, the set of nets traverse a set of routing tiles. At step 115, the method looks at the first tile traversed by the net. At step 120, the method assigns the congestion metric of the first tile as the utilization metric for the net. At step 125, the method determines whether the net traverses another tile. In some embodiments, the method may access the physical description of the integrated circuit design to determine whether the net traverses another routing tile. When designing an integrated circuit, a chip undergoes logical synthesis and physical design. During physical design, the components are placed in the design, logic and timing problems are fixed or changed, placement is legalized, and routing is performed. A record is kept of the design and the method may access this record of the physical description of the integrated circuit design for optimization or modification purposes or whenever else it is necessary. Here the method may determine if the net traverses another routing tile. If the net traverses another routing tile it will look at the congestion metric of that routing tile 130. If the net does not traverse another routing tile, the net has its confirmed utilization metric and the method determines if there are any remaining nets in the integrated circuit design 140.

In this example, if the net traverses another routing tile and has looked at the congestion metric of the routing tile the net traverses 130, the method will determine whether the congestion metric of this tile is greater than the current utilization metric of the net 135. In some embodiments, the method may access the current utilization metric stored in memory and compare it with the congestion metric of the routing tile. If the congestion metric is larger than the current utilization metric, the congestion metric replaces the current utilization metric as the utilization metric of the net 120 and the method then determines again if the net traverses another routing tile 125. If the congestion metric is not larger than the current utilization metric, the current utilization metric remains the utilization metric of the net and the method then determines again if the net traverses another routing tile 125. The method continues this process of determining traversed routing tiles 125, comparing congestion metrics with current utilization metrics 135, and assigning utilization metrics 120 until all the congestion metrics from the routing tiles traversed by the net have been determined 130, compared 135, and the largest congestion metric from the routing tiles traversed by the net has been assigned as the utilization metric of the net 120. After the utilization metric from the largest congestion metric has been assigned to the net 120 and the net does not traverse another routing tile 125, the method determines whether there are any more nets that need to be assigned a utilization metric 140. In some embodiments, the method may accomplish this by determining the number of nets that exist in the integrated circuit design and determining whether this number is equivalent to the number of nets that it has assigned a utilization metric. If the number of nets that exist in the integrated circuit design is not equivalent to the number of nets that it has assigned a utilization metric, the method continues the process of determining traversed routing tiles 125, comparing congestion metrics with current utilization metrics 135, and assigning utilization metrics 120 until all nets in the integrated circuit design have been assigned a utilization metric. If the number of nets that exist in the integrated circuit design is equivalent to the number of nets that is has assigned a utilization metric, the method can determine the set of sparse nets in the integrated circuit design.

Figure 1B:
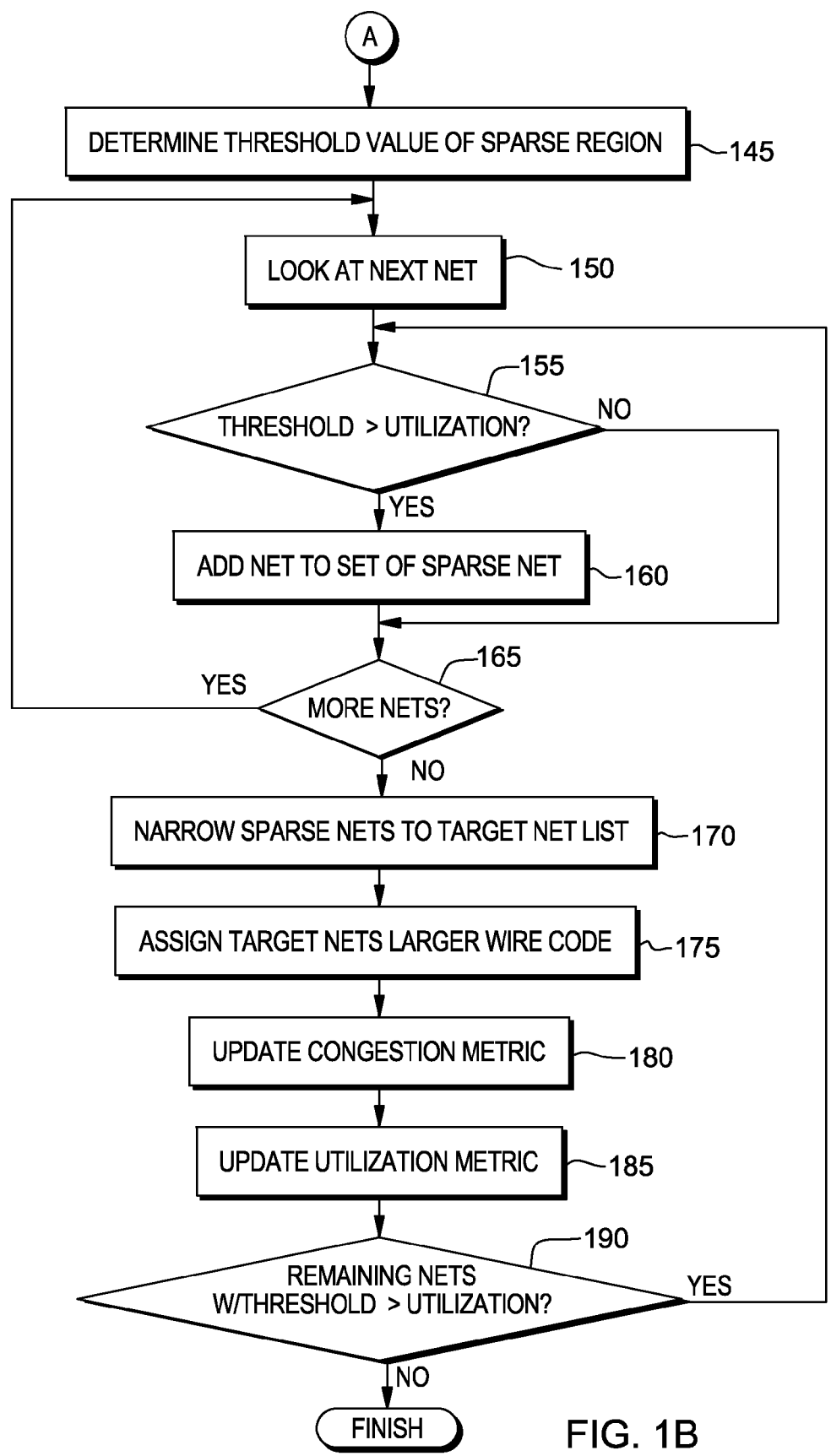
FIG. 1B is a portion of a flow diagram illustrating an example embodiment of a method for utilizing available wiring resources in sparse wiring areas of an integrated circuit design.

Flow diagram 100 in FIG. 1B is a portion of a flow diagram illustrating an example embodiment of a method for utilizing available wiring resources in sparse wiring areas of an integrated circuit design. In this example, to determine the set of sparse nets from the set of nets that exist in the integrated circuit design, the method may determine a threshold value where the set of sparse nets comprises nets that have a utilization metric less than the threshold value. At step 145, the method establishes a threshold value that defines a maximum value a utilization metric can have to be considered as existing in a sparse region of an integrated circuit design. The threshold value can be any value the designer deems is safe for any region to have as a utilization metric and still allow the integrated circuit to work properly. At step 150, the method looks at a net in the integrated circuit design. At step 155, the method determines whether the threshold value is greater than the utilization metric of the net. In some embodiments, the method may access the utilization metric of the net stored in memory and compare it with the user defined threshold value. If the threshold value is larger than the utilization metric of the net, the net is added to the set of sparse nets of the integrated circuit design 160. If the threshold value is not larger than the utilization metric of the integrated circuit design, the net is not added to the set of sparse nets of the integrated circuit design. After the net has or has not been added to the set of sparse nets, the method then determines whether there are more nets in the integrated circuit design that need to be examined to see whether they should be added to the set of sparse nets 165. In some embodiments, the method may accomplish this by determining the number of nets that exist in the integrated circuit design and determining whether this number is equivalent to the number of nets that it has determined should or should not be added to the set of sparse nets. If the number of nets that exist in the integrated circuit design is not equivalent to the number of nets that the method has determined should or should not be added to the set of sparse nets, then the method will look at the next net 150 and continues the process of comparing the threshold value with the utilization metric of the remaining nets in the integrated circuit design 155. If the number of nets that exist in the integrated circuit design is equivalent to the number of nets that the method has determined should or should not be added to the set of sparse nets, then the method can proceed to narrow the set of sparse nets to one or more target nets that will be assigned a larger wire code 170.

To prepare for step 175, in which the target nets are assigned a larger wire code, the set of sparse nets is narrowed to a set of target nets 170. The method used to narrow the set of sparse nets to target nets may depend on the selection size of the set of target nets to prevent too many nets from being enlarged in the same tile at one time which could cause the congestion metrics to grow larger than desired. In example flow diagram 100, because the method from step 175 is configured to assign a larger wire code to target nets, these target nets are kept for the method to assign them a larger wire code. A sparse net that is not kept as a target net is not assigned a larger wire code, however, this does not rule out the chance that the sparse net may still observe an increase in its own utilization metric. For example, a target net that is assigned a larger wire code may increase the congestion metric of a routing tile when the process updates the congestion metrics of integrated circuit design. That congestion metric may be assigned as the updated utilization metric for a net that was already not included in the set of sparse nets nor the one or more target nets.

At step 175, the target nets are assigned a larger wire code. The assignment of a larger wire code may be, for example, added isolation of the target net, wider width of the net, or any modification to the net that results in reducing the circuit delay. A main cause in circuit delay is the resistances and the capacitances of the nets. The greater the resistance of a net or the capacitance between nets, the greater the circuit delay. Therefore, a fundamental design consideration is to minimize the parasitic resistances and capacitances of the nets.

Current flow in a net is the result of the movement of electrons under the influence of an applied electric field. As electrons flow across a net, they constantly collide with atoms making up the net. These collisions impede the flow of electrons and cause the net to have resistance, thus, if the width of the net is larger, the electrons will not collide as frequently with the atoms of the net, therefore, decreasing the resistance of the net.

Capacitance is a measure of the charge-storing capacity of two parallel plates when a voltage is applied between them. Couple noise or crosstalk is the electrical noise mainly caused by capacitance between signal conductors due to their close proximity to each other. Crosstalk can cause integrated circuit failure due to false signals appearing on a net or circuit timing deviation. The maximum crosstalk allowed for a given integrated circuit, determines the minimum spacing between nets. As the spacing between nets increases, the capacitance and crosstalk decreases.

After the larger wire codes have been assigned, the congestion metrics of the routing tiles of the integrated circuit design are updated 180. Furthermore, when the congestion metrics of the routing tiles are updated, the values of the utilization metric of the nets of the integrated circuit design may no longer be correct. Therefore, at step 185, the utilization metric of the nets of the integrated circuit design are updated. At step 190, the method determines whether there are any nets of the integrated circuit design that have a utilization metric value larger than the threshold value. In some embodiments, the method may access the utilization metrics of the nets stored in memory and compare it to the user defined threshold value 155. If the threshold value is larger than the utilization metrics of the nets, the nets are added to the set of sparse nets of the integrated circuit design 160. If the threshold value is not larger than the utilization metrics of the nets, there is no remaining sparse area of the integrated circuit design and the process of utilizing available wiring resources in sparse wiring areas of the design is complete.

Although example method 100 describes loops in which the method determines whether a net traverses tiles 125, compares congestion metrics to utilization metrics 135, determines if every net of the integrated circuit design has a utilization metric 140, determines if every net has been checked to see whether it should be added to the set of sparse nets 165, and compares the threshold value to the updated utilization metrics 190, these loops are for illustration purposes only. Embodiments may use other processes or techniques for determining or comparing these situations. Embodiments for utilizing available wiring resources in sparse wiring areas of the integrated circuit design may not perform each step shown in example 100, may perform some or all of the steps in a different order, or may perform additional steps not shown. Furthermore, embodiments may combine several steps or expand individual steps into multiple steps.

Figure 2:
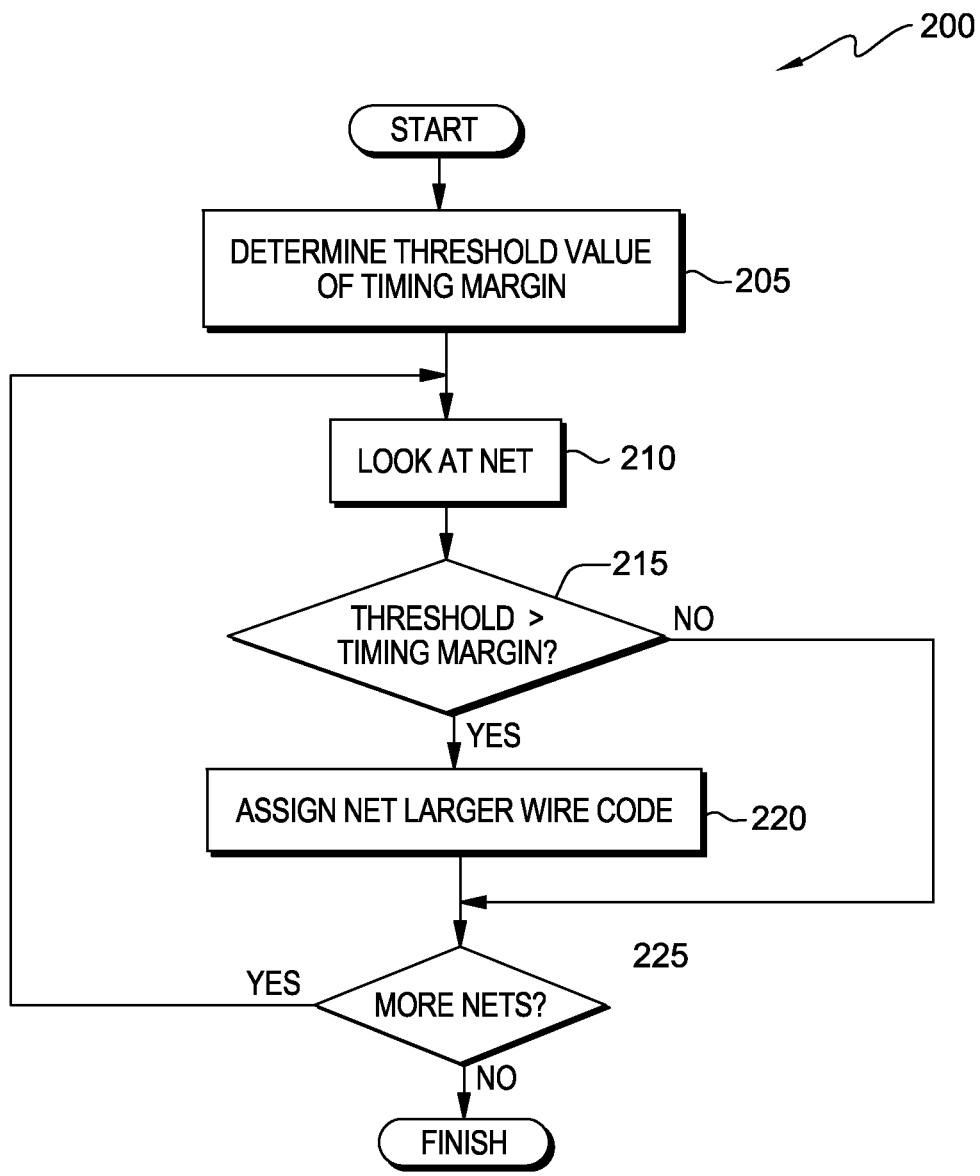
FIG. 2 is a flow diagram illustrating an example embodiment of a method of narrowing the set of sparse nets to a list of target nets and assigning the target nets a larger wire code.

Flow diagram 200 in FIG. 2 is a flow diagram illustrating an example embodiment of a method of narrowing the set of sparse nets to a list of target nets and assigning the target nets a larger wire code. At step 205, the method determines the threshold value of the timing margin. This threshold value is separate and different from the threshold value for the utilization metrics. However, both threshold values are user defined and both may be used to achieve a maximum value the designer deems is safe for any region in the integrated circuit design to have as a congestion metric and still allow the integrated circuit to work properly. At step 210, the method looks at the net in the integrated circuit design. At step 215, the method determines whether the threshold value is larger than the value of the timing margin of the net. In some embodiments, the method may access the netlist of the integrated circuit design. As previously stated, the netlist describes a list of connections by indicating which pins should be connected to form a set of nets. Within the netlist is also information pertaining to each net, such as the width of the net and its timing margin value. The method may access the timing margin value of the net and compare with the user defined threshold value. If the threshold value is larger than the timing margin value of the net, the net is determined to be a target net and will be assigned a larger wire code. If the threshold value is not larger than the timing margin value of the net, the net is not a target net, therefore, it is not assigned larger wire code. At step 220, the target net is assigned a larger wire code. The assignment of a larger wire code may be, for example, added isolation of the target net or wider width of the net. At step 225, the method determines whether there are any more sparse nets that could potentially be added to the list of target nets. In some embodiments, the method may accomplish this by determining the number of sparse nets that exist in the integrated circuit design and determine whether this number is equivalent to the number of nets that it has determined should or should not be added to the list of target nets. If the number of sparse nets that exist in the integrated circuit design is not equivalent to the number of nets that the method has determined should or should not be added to the list of target nets, then the method continues the process of narrowing the set of sparse nets to a list of target nets and assigning the target nets a larger wire code.

Although example method 200 describes the method determining whether a sparse net should be added to the list of target nets by comparing the timing margin of a net with a user defined threshold value 215 and determines whether there are anymore nets that could potentially be added to the list of target nets based upon the equivalence of the set of sparse nets and the number of nets the method has determined should or should not be added to the list of target nets 225, these determinations are for illustration purposes only. Embodiments may use other techniques for determining whether the sparse net should be added to the list of target nets or whether there are anymore sparse nets to check. Also, embodiments for narrowing the set of sparse nets to a list of target nets and assigning the target nets a larger wire code, may not perform each step shown in example 200, may perform some or all of the steps in a different order, or may perform additional steps not shown. Furthermore, embodiments may combine steps or expand individual steps into multiple steps.

Figure 3:
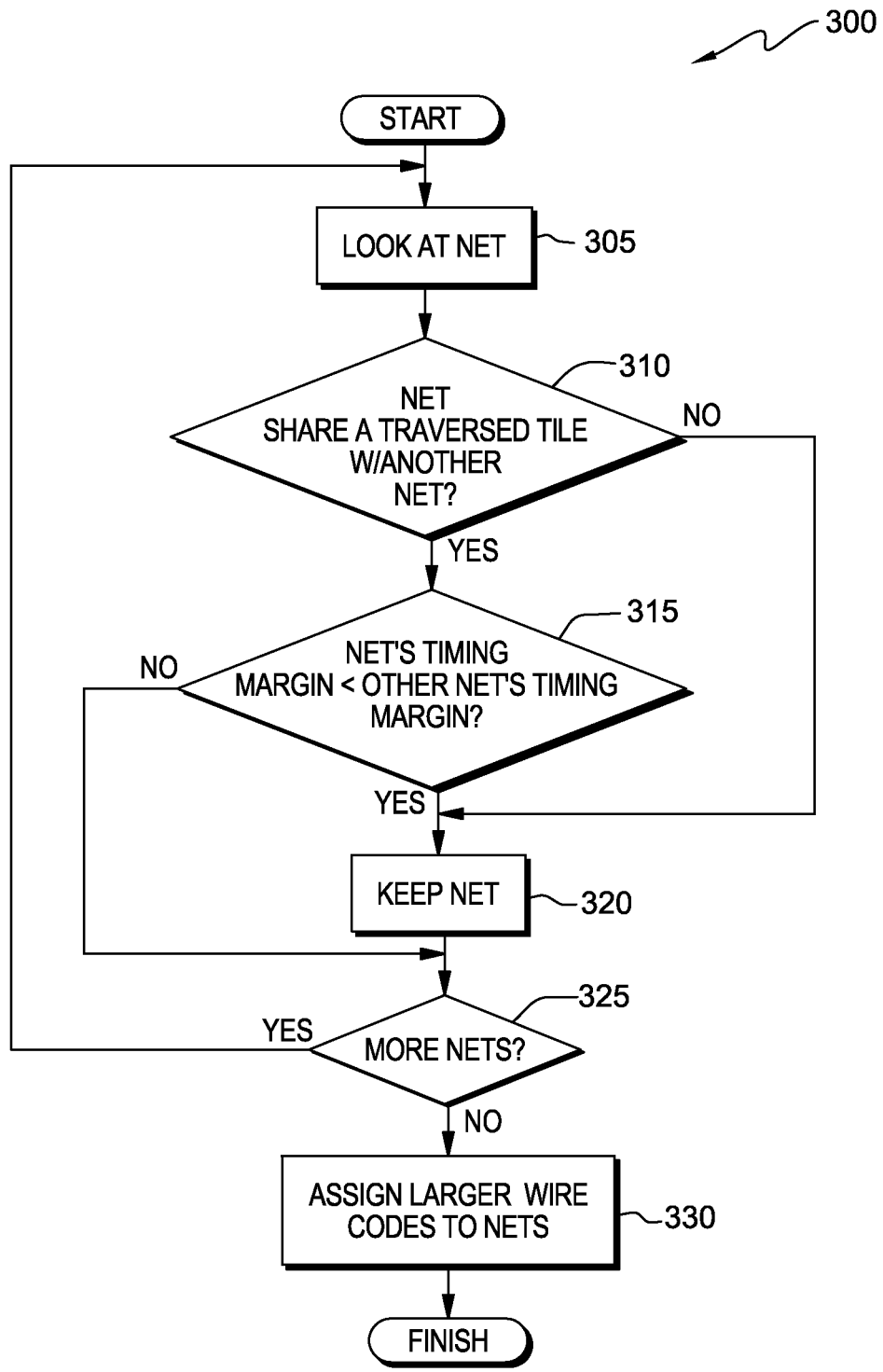
FIG. 3 is a flow diagram illustrating an example embodiment of a method of narrowing the set of sparse nets to a list of target nets and assigning the target nets a larger wire code.

Flow diagram 300 in FIG. 3 is also a flow diagram illustrating an example embodiment of a method of narrowing the set of sparse nets to a list of target nets and assigning the target nets a larger wire code. At step 305, the method looks at a net in the integrated circuit design. At step 310, the method determines whether the net traverses a routing tile that another sparse net traverses. In some embodiments, the method may access the physical description of the integrated circuit design to determine whether the net traverses the same routing tile as another sparse net. A record is kept of the integrated circuit design and the method may access this record for optimization or modification purposes or whenever else it is necessary. In this example, if the method determines that the net does not traverse the same routing tile as another sparse net, the net will be temporarily kept as a candidate for the list of target nets 320. However, if the method determines that the net traverses the same routing tile as another sparse net, further evaluation of the nets is done. In this example, further evaluation is done at step 315, where the method determines whether the net has a smaller timing margin than the other sparse nets for which it shares a routing tile. In some embodiments, the method may access the netlist of the integrated circuit design and compare the timing margin value of the net with the timing margin value of the other sparse nets for which the net traverses a same routing tile. If the method determines that the net has a smaller timing margin than the other sparse nets, the net will be temporarily kept as a candidate for the list of target nets 320. If the method determines that the net has a larger timing margin than another sparse net, the net will not be added to the list of target nets.

Figure 4:
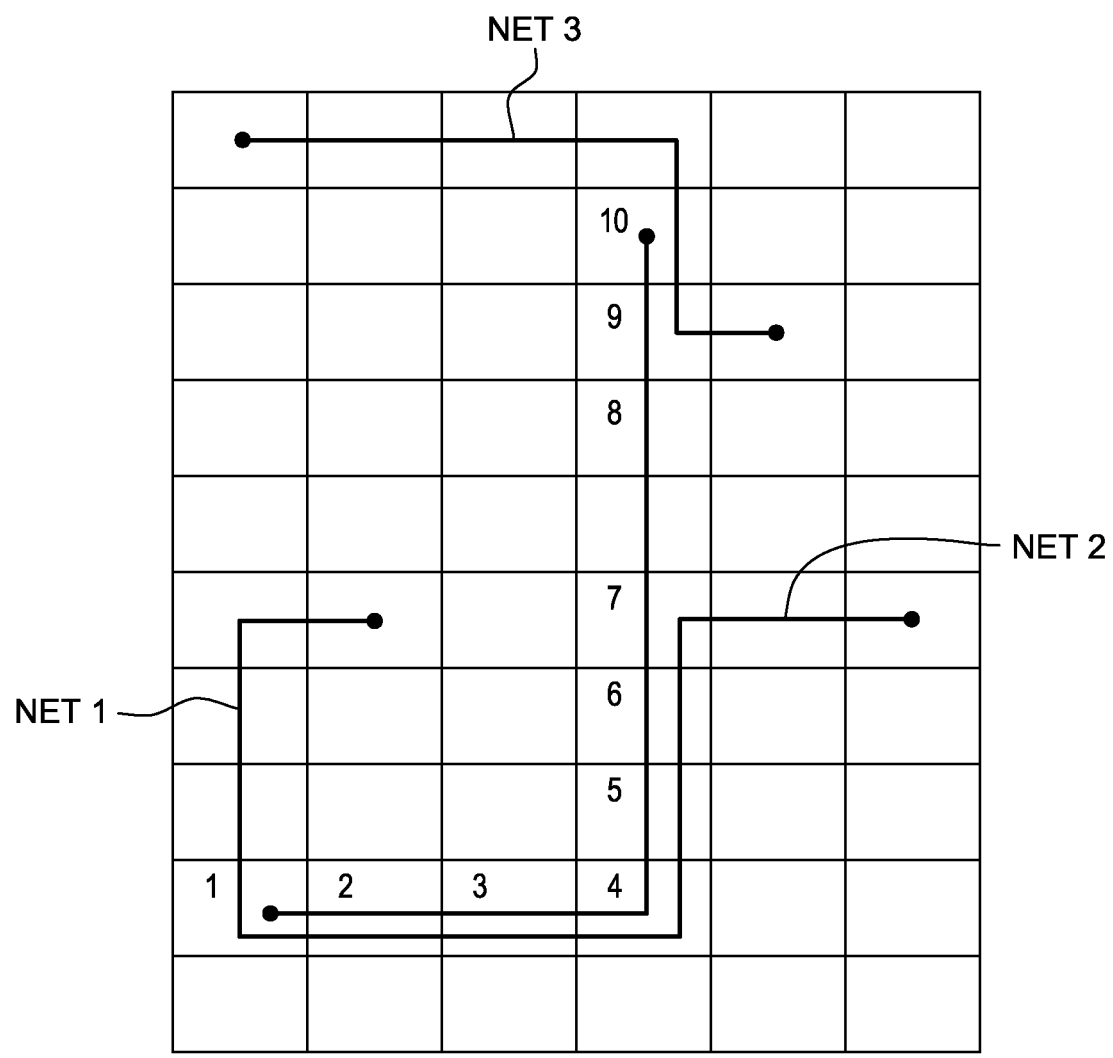
FIG. 4 is a simplified depiction of an example integrated circuit design partitioned into a grid of routing tiles.

The process of FIG. 3 can be illustrated by the diagram of FIG. 4. FIG. 4 is a simplified depiction of an example integrated circuit design partitioned into a grid of routing tiles. Some of the routing tiles have been numbered. Furthermore, in FIG. 4, there exist three sparse nets numbered accordingly. As shown, Net 1 and Net 2 traverse routing tiles 1-7 and Net 1 and Net 3 traverse routing tiles 9-10. In this example, the method will determine that Net 1 traverses a routing tile that is also traversed by Net 2 310 and Net 1 traverses a routing tile that is also traversed by Net 3 310. The method will then compare the timing margin value of Net 1 to the timing margin value of Net 2 and Net 3 315. If either the timing margin of Net 2 or Net 3 is smaller than the timing margin of Net 1, Net 1 will not be added to the list of target nets and Net 2 and Net 3 will temporarily be kept as candidates for the list of target nets 320. If Net 1 has a smaller timing margin than Net 2 and Net 3, Net 1 will be temporarily kept as a candidate for the list of target nets and Net 2 and Net 3 will not be added to the list of target nets 320.

In another example, the method determines whether the net traverses the same routing tile as another sparse net 310. However, in a variation on FIG. 3, the method then takes another step before determining whether the net has a smaller timing margin than the other sparse nets for which it shares a routing tile 315. The method first determines whether the routing tile traversed by each net is the routing tile that assigned its congestion metric as the utilization metric for each net. If the method determines the routing tile assigned its congestion metric as the utilization metric for each net, then the method will compare the timing margin values of the nets 315 and temporarily keep the net with the smallest timing margin as a candidate for the list of target nets 320 as previously described. If the method determines that the routing tile did not assign its congestion metric as the utilization metric for each net, then all the nets will be temporarily kept as candidates for the list of target nets 320.

The variation of FIG. 3 can be illustrated by the diagram of FIG. 4. As shown, Net 1 and Net 2 traverse routing tiles 1-7 and Net 1 and Net 3 traverse routing tiles 9-10. In this example, the method will determine that Net 1 traverses a routing tile that is also traversed by Net 2 and Net 1 traverses a routing tile that is also traversed by Net 3 310. The method will then determine whether routing tiles 1-7 assigned their congestion metric as the utilization metric for Net 1 and Net 2. For instance, if the utilization metric of Net 1 was assigned from the congestion metric of routing tile 3 and the utilization metric for Net 2 was also assigned from the congestion metric of routing tile 3, then the method would compare the timing margin value of Net 1 to the timing margin value of Net 2 315 and temporarily keep the net with the smaller timing margin as a candidate for the list of target nets 320 and the other will not be added to the list of target nets. However, if the utilization metric of Net 1 was assigned from the congestion metric of routing tile 8 and the utilization metric of Net 2 was assigned from the congestion metric of routing tile 3, then the method would see that, although these nets traverse some of the same routing tiles, their utilization metric was not assigned from the same routing tile and both would be temporarily kept as candidates for the list of target nets 320. Similarly, the method will follow this process to determine whether Net 1 and Net 3 were assigned their utilization metric from the congestion metric of the same traversed routing tile and determine, accordingly, whether they should be temporarily kept as a candidate for the list of target nets 320.

The examples described have been illustrated in detail to elaborate on the freedom the designer has in evaluating how efficiently their integrated circuit design can operate with the increase in the number of sparse nets added to the list of target nets and assigned larger wire codes. These examples have also been illustrated to stress the importance of the congestion metrics. The designer is responsible for understanding the conditions their integrated circuit will be under and to decide at what point the congestion of the nets of the integrated circuit design, start to have a detrimental effect on the overall operation of the integrated circuit. With this in mind, the designer has the capability to maximize the list of target nets that are assigned larger wire codes and increase the percentage that the arrival time of the signal will not exceed its required time, therefore, decreasing the chance of integrated circuit failure.

At step 325, in FIG. 3, the method determines whether there are any more sparse nets that could potentially be added to the list of target nets. In some embodiments, the method may accomplish this by determining the number of sparse nets that exist in the integrated circuit design and determine whether this number is equivalent to the number of nets that it has determined should or should not be temporarily kept as candidates for the list of target nets. If the number of sparse nets that exist in the integrated circuit design is not equivalent to the number of nets that the method has determined should or should not be temporarily kept as candidates for the list of target nets, then the method continues the process of determining whether a sparse net should be temporarily kept as a candidate for the list of target nets. If the number of sparse nets that exist in the integrated circuit design is equivalent to the number of nets that the method has determined should or should not be temporarily kept as candidates for the list of target nets, then there are no remaining sparse nets that could potentially remove any of the temporarily kept sparse nets from the list of target nets. Therefore, the remaining temporarily kept sparse nets are now permanently added to the list of target nets and, at step 330, the target nets are assigned larger wire codes.

Although example method 300 describes the method determining whether a net traverses a routing tile that another sparse net traverses 310 by accessing a record of the physical description of the integrated circuit design, and determines whether the net has a smaller timing margin value as other sparse nets 315 by accessing the netlist and comparing the timing margin values, and determines whether there are anymore sparse nets that could potentially be added to the list of target nets 325 based upon the equivalence of the set of sparse nets and the number of nets the method has determined should or should not be temporarily kept as candidates for the list of target nets, these determinations are for illustration purposes only. Embodiments may use other techniques for determining whether a net traverses a routing tile that another sparse net traverses, or determining whether the net has a smaller timing margin value than other sparse nets, or whether there are any more sparse nets that could potentially be added to the list of target nets. Also, embodiments for narrowing the set of sparse nets to a list of target nets and assigning the target nets a larger wire code, may not perform each step shown in example 300, may perform some or all of the steps in a different order, or may perform additional steps not shown. Furthermore, embodiments may combine steps or expand individual steps into multiple steps.

Figure 5:
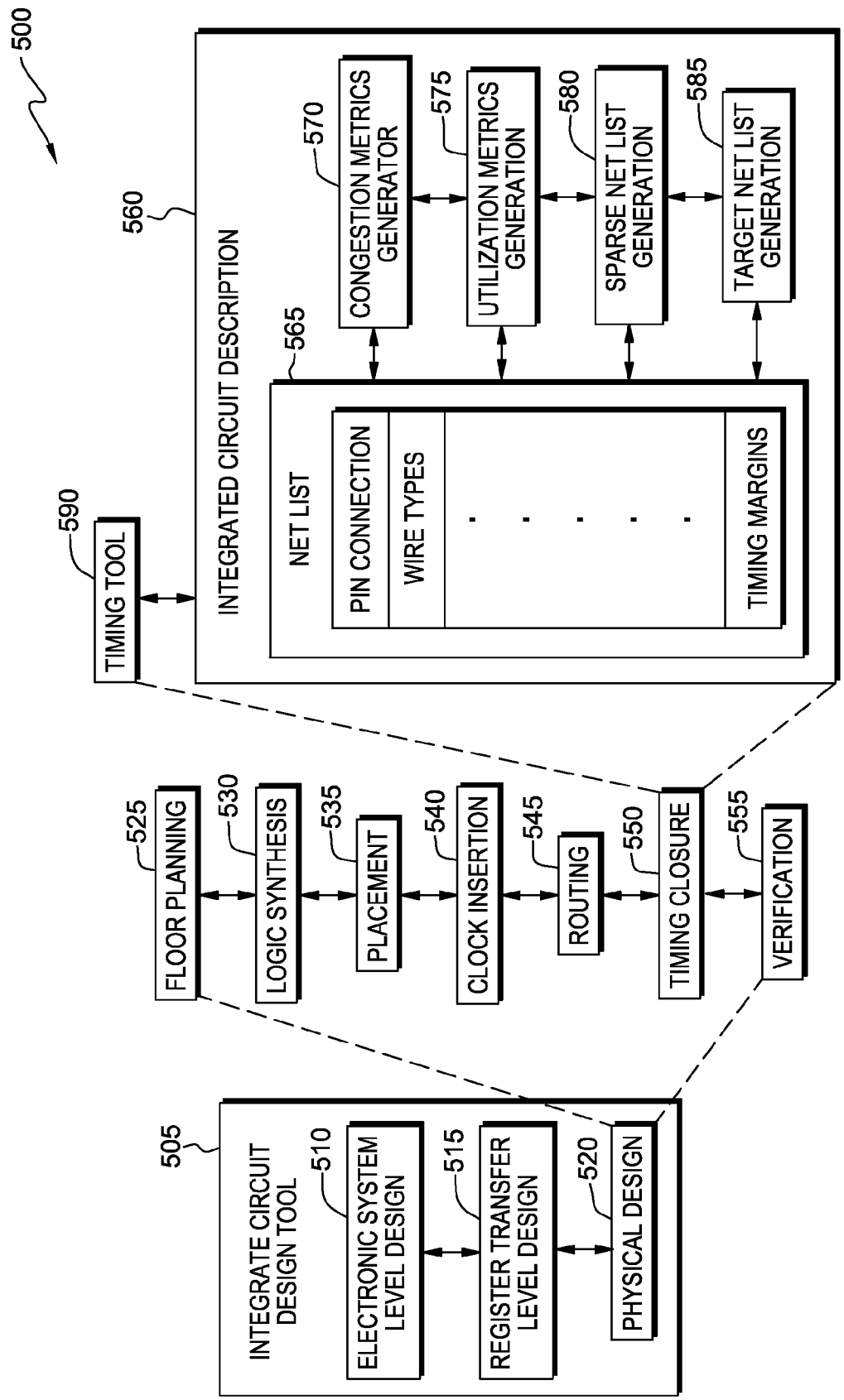
FIG. 5 is an example system for utilizing available wiring resources in sparse wiring areas of the integrated circuit design.

Example 500 in FIG. 5 shows an example system for utilizing available wiring resources in sparse wiring areas of the integrated circuit design.

Initially the Integrated Circuit Design Tool 505 may use a sequential process to develop an integrated circuit. In this example, within the Integrated Circuit Design Tool is an Electronic System Level Design Tool 510. The Electronic System Level Design Tool 510 may create the documentation that describes the requested behavior of the integrated circuit design. The documentation may describe through a variety of languages and tools what the design must do as well as the properties of the inputs and outputs. Also, within the Integrated Circuit Design Tool 505 and after the Electronic System Level Design Tool 510 has run, the Integrated Circuit Design Tool 505 may initiate the Register Transfer Level Design Tool 515. The Register Transfer Level Design Tool 515 may take the documentation describing what the integrated circuit design does, developed by the Electronic System Level Design Tool 510, and may convert it into a register transfer level description. The register transfer level description may describe the exact behavior of the integrated circuit and the interconnections to inputs and outputs. Also, within the Integrated Circuit Design Tool 505 and after the Register Transfer Level Design Tool 515 has run, the Integrated Circuit Design Tool 505 may initiate the Physical Design Tool 520. The Physical Design Tool 520 may take the register level description and with the help of a library of available logic gates, may create an integrated circuit design. This entails figuring out which logic gates to use, deciding where to place them, and wiring them together.

In this example, the Physical Design Tool 520, may use a sequential process to create the integrated circuit design. Within the Physical Design Tool 520 may be a Floor Planning Tool 525. The Floor Planning Tool 525 may take the register level description and may assign it to regions of the integrated circuit design and the input and output pins may be assigned. Within the Physical Design Tool 520 and after the Floor Planning Tool 525 may also be a Logic Synthesis Tool 530. The Logic Synthesis Tool 530 may map the register level description into a logic gate-level netlist. Within the Physical Design Tool 520 and after the Logic Synthesis Tool 530 may also be a Placement Tool 535. The Placement Tool 535 may assign the logic gates in the netlist to non-overlapping areas on the integrated circuit design. Within the Physical Design Tool 520 and after the Placement Tool 535 may also be a Clock Insertion Tool 540. The Clock Insertion Tool 540 may introduce the clock signal wiring into the integrated circuit design. Within the Physical Design Tool 520 and after the Clock Insertion Tool 540 may also be a Routing Tool 545. The Routing Tool 545 may place the wires that connect the logic gates in the netlist. Within the Physical Design Tool 520 and after the Routing Tool 545 may also be a Timing Closure Tool 550. The Timing Closure Tool 550 may do post-routing optimization where performance and signal integrity are checked and violations are removed. Furthermore, the integrated circuit design may be modified to make it as easy and efficient as possible to produce. Within the Physical Design Tool 520 and after the Timing Closure Tool 550 may also be a Verification Tool 555. The Verification Tool 555 may perform error checking to make sure the mapping of the logic gates was done correctly and that the rules and timing requirements were followed.

In this example, the Timing Closure Tool 550, may have an integrated circuit design where the logic gates have been placed, the wires have been routed, and the clock signal has been inserted. In this example, within the Timing Closure Tool 550 may be an Integrated Circuit Description 560 and within the Integrated Circuit Description 560 may be a Netlist 565, a Congestion Metrics Generator 570, a Utilization Metrics Generator 575, a Sparse Net List Generator 580, and a Target Net List Generator 585. In this example, the Integrate Circuit Description 560 may have the congestion metric of each routing tile in the integrated circuit design recorded in the Congestion Metrics Generator 570. The Congestion Metrics Generator 570 and the Netlist 565 may observe the routing tiles that each net traverses. The Utilization Metrics Generator 575 may interact with the Netlist 565 and the Congestion Metrics Generator 570 and may assign the largest congestion metric from the set of routing tiles that a net traverses as the utilization metric for that net and may also keep a record of each utilization metric for each net. There may be a user defined input value for the utilization metric threshold value and the Utilization Metrics Generator 575 may interact with the Sparse Net List Generator 580. The Sparse Net List Generator 580 may compare the recorded utilization metrics with the utilization metric threshold value. In this example, any utilization metric lower than the utilization metric threshold value will be included as a sparse net and the Sparse Net List Generator 580 may keep a record of which nets are included as sparse nets. The Sparse Net List Generator 580 may interact with the Target Net List Generator 585 and the Target Net List Generator 585 may also interact with the Netlist 565. The Netlist 565 may provide the Target Net List Generator 585 with information regarding the timing margins of the nets and the Sparse Net List Generator 580 may provide the Target Net List Generator 585 with information regarding which nets are sparse nets. The Target Net List Generator 585 may determine which nets it needs information regarding their timing margin from the Netlist 565. In this example, there may be a user defined input value for the timing margin threshold value and the Target Net List Generator 585 may compare the timing margin value of each sparse net with the timing margin threshold value and may temporarily keep the sparse nets with a timing margin value lower than the timing margin threshold value. The Target Net List Generator 585 may perform additional operations to decrease the size of the number of sparse nets included in the temporarily kept sparse nets. The Target Net List Generator 585 may then keep a record of which nets are included as target nets. The Integrated Circuit Description 560 may interact with the Timing Tool 590 and the Timing Tool 590 may include a wire code modifier to modify the wire codes of the target nets that are recorded by the Target Net List Generator 585. The modification, in this example, may be increased isolation of the target nets or extra wide metal for the target nets. The Timing Tool 590 may provide the Integrated Circuit Description 560 with information regarding the modified wire codes for the target nets. The Integrated Circuit Description 560 may update the congestion metrics of the routing tiles of the integrated circuit design and the Congestion Metrics Generator 570 may keep a record of the updated congestion metric values. In this example, each component may continue their operation until all nets no longer have a utilization metric value below the user defined utilization metric threshold value.

Figure 6:
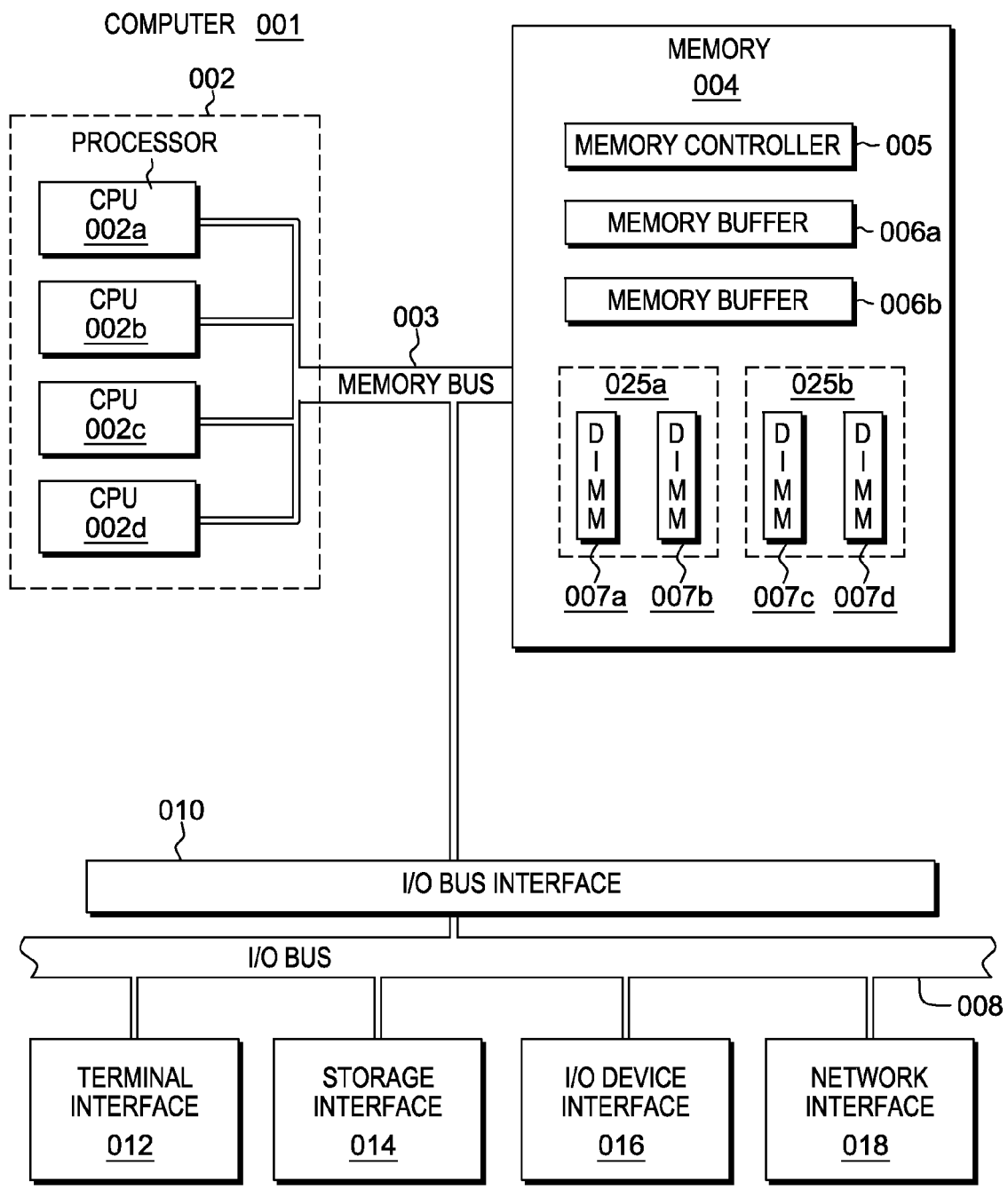
FIG. 6 depicts a high-level block diagram of an example system according to an embodiment of the invention.

FIG. 6 depicts a high-level block diagram of an example system for implementing an embodiment. The mechanisms and apparatus of embodiments of the present invention apply equally to any appropriate computing system. The major components of the computer system 001 comprise one or more CPUs 002, a memory subsystem 004, a terminal interface 012, a storage interface 014, an I/O (Input/Output) device interface 016, and a network interface 018, all of which are communicatively coupled, directly or indirectly, for inter-component communication via a memory bus 003, an I/O bus 008, and an I/O bus interface unit 010.

The computer system 001 may contain one or more general-purpose programmable central processing units (CPUs) 002A, 002B, 002C, and 002D, herein generically referred to as the CPU 002. In an embodiment, the computer system 001 may contain multiple processors typical of a relatively large system; however, in another embodiment the computer system 001 may alternatively be a single CPU system. Each CPU 002 executes instructions stored in the memory subsystem 004 and may comprise one or more levels of on-board cache.

In an embodiment, the memory subsystem 004 may comprise a random-access semiconductor memory, storage device, or storage medium (either volatile or non-volatile) for storing data and programs. In another embodiment, the memory subsystem 004 may represent the entire virtual memory of the computer system 001, and may also include the virtual memory of other computer systems coupled to the computer system 001 or connected via a network. The memory subsystem 004 may be conceptually a single monolithic entity, but in other embodiments the memory subsystem 004 may be a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory or memory subsystem 004 may contain elements for control and flow of memory used by the CPU 002. This may include all or a portion of the following: a memory controller 005, one or more memory buffer 006 and one or more memory devices 007. In the illustrated embodiment, the memory devices 007 may be dual in-line memory modules (DIMMs), which are a series of dynamic random-access memory (DRAM) chips 015a-015n (collectively referred to as 015) mounted on a printed circuit board and designed for use in personal computers, workstations, and servers. The use of DRAMs 015 in the illustration is exemplary only and the memory array used may vary in type as previously mentioned. In various embodiments, these elements may be connected with buses for communication of data and instructions. In other embodiments, these elements may be combined into single chips that perform multiple duties or integrated into various types of memory modules. The illustrated elements are shown as being contained within the memory subsystem 004 in the computer system 001. In other embodiments the components may be arranged differently and have a variety of configurations. For example, the memory controller 005 may be on the CPU 002 side of the memory bus 003. In other embodiments, some or all of them may be on different computer systems and may be accessed remotely, e.g., via a network.

Although the memory bus 003 is shown in FIG. 6 as a single bus structure providing a direct communication path among the CPUs 002, the memory subsystem 004, and the I/O bus interface 010, the memory bus 003 may in fact comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 010 and the I/O bus 008 are shown as single respective units, the computer system 001 may, in fact, contain multiple I/O bus interface units 010, multiple I/O buses 008, or both. While multiple I/O interface units are shown, which separate the I/O bus 008 from various communications paths running to the various I/O devices, in other embodiments some or all of the I/O devices are connected directly to one or more system I/O buses.

In various embodiments, the computer system 001 is a multi-user mainframe computer system, a single-user system, or a server computer or similar device that has little or no direct user interface, but receives requests from other computer systems (clients). In other embodiments, the computer system 001 is implemented as a desktop computer, portable computer, laptop or notebook computer, tablet computer, pocket computer, telephone, smart phone, network switches or routers, or any other appropriate type of electronic device.

FIG. 6 is intended to depict the representative major components of an exemplary computer system 001. But individual components may have greater complexity than represented in FIG. 6, components other than or in addition to those shown in FIG. 6 may be present, and the number, type, and configuration of such components may vary. Several particular examples of such complexities or additional variations are disclosed herein. The particular examples disclosed are for example only and are not necessarily the only such variations.

The memory buffer 006, in this embodiment, may be intelligent memory buffer, each of which includes an exemplary type of logic module. Such logic modules may include hardware, firmware, or both for a variety of operations and tasks, examples of which include: data buffering, data splitting, and data routing. The logic module for memory buffer 006 may control the DIMMs 007, the data flow between the DIMM 007 and memory buffer 006, and data flow with outside elements, such as the memory controller 005. Outside elements, such as the memory controller 005 may have their own logic modules that the logic module of memory buffer 006 interacts with. The logic modules may be used for failure detection and correcting techniques for failures that may occur in the DIMMs 007. Examples of such techniques include: Error Correcting Code (ECC), Built-In-Self-Test (BIST), extended exercisers, and scrub functions. The firmware or hardware may add additional sections of data for failure determination as the data is passed through the system. Logic modules throughout the system, including but not limited to the memory buffer 006, memory controller 005, CPU 002, and even the DRAM 0015 may use these techniques in the same or different forms. These logic modules may communicate failures and changes to memory usage to a hypervisor or operating system. The hypervisor or the operating system may be a system that is used to map memory in the system 001 and tracks the location of data in memory systems used by the CPU 002. In embodiments that combine or rearrange elements, aspects of the firmware, hardware, or logic modules capabilities may be combined or redistributed. These variations would be apparent to one skilled in the art.

Embodiments described herein may be in the form of a system, a method, or a computer program product. Accordingly, aspects of embodiments of the invention may take the form of an entirely hardware embodiment, an entirely program embodiment (including firmware, resident programs, micro-code, etc., which are stored in a storage device) or an embodiment combining program and hardware aspects that may all generally be referred to herein as a "circuit," "module," or "system." Further, embodiments of the invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium, may be, for example, but not limited to, an electronic, magnetic, optical, electromagnetic, infrared, or semiconductor system, apparatus, or device, or any suitable combination of the foregoing. More specific examples (an non-exhaustive list) of the computer-readable storage media may comprise: an electrical connection having one or more wires, a portable computer diskette, a hard disk, a random access memory (RAM), a read-only memory (ROM), an erasable programmable read-only memory (EPROM) or Flash memory, an optical fiber, a portable compact disc read-only memory (CD-ROM), an optical storage device, a magnetic storage device, or any suitable combination of the foregoing. In the context of this document, a computer-readable storage medium may be any tangible medium that can contain, or store, a program for use by or in connection with an instruction execution system, apparatus, or device.

A computer-readable signal medium may comprise a propagated data signal with computer-readable program code embodied thereon, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that communicates, propagates, or transports a program for use by, or in connection with, an instruction execution system, apparatus, or device. Program code embodied on a computer-readable medium may be transmitted using any appropriate medium, including but not limited to, wireless, wire line, optical fiber cable, Radio Frequency, or any suitable combination of the foregoing.

Embodiments of the invention may also be delivered as part of a service engagement with a client corporation, nonprofit organization, government entity, or internal organizational structure. Aspects of these embodiments may comprise configuring a computer system to perform, and deploying computing services (e.g., computer-readable code, hardware, and web services) that implement, some or all of the methods described herein. Aspects of these embodiments may also comprise analyzing the client company, creating recommendations responsive to the analysis, generating computer-readable code to implement portions of the recommendations, integrating the computer-readable code into existing processes, computer systems, and computing infrastructure, metering use of the methods and systems described herein, allocating expenses to users, and billing users for their use of these methods and systems. In addition, various programs described hereinafter may be identified based upon the application for which they are implemented in a specific embodiment of the invention. But, any particular program nomenclature that follows is used merely for convenience, and thus embodiments of the invention are not limited to use solely in any specific application identified and/or implied by such nomenclature. The exemplary environments are not intended to limit the present invention. Indeed, other alternative hardware and/or program environments may be used without departing from the scope of embodiments of the invention.

While the invention has been described with reference to the specific aspects thereof, those skilled in the art will be able to make various modifications to the described aspects of the invention without departing from the true spirit and scope of the invention. The terms and descriptions used herein are set forth by way of illustration only and are not meant as limitations. Those skilled in the art will recognize that these and other variations are possible within the spirit and scope of the invention as defined in the following claims and their equivalents.

The invention claimed is:

1. A method of analyzing an integrated circuit design arranged into a grid of routing tiles, the method comprising:
    accessing memory for a netlist of the integrated circuit design;
    identifying a set of nets that traverse a set of routing tiles of the integrated circuit design, each net traversing at least one routing tile;
    identifying a set of timing margins for the set of nets, each net having at least one timing margin;
    identifying a set of congestion metrics for the set of routing tiles, each routing tile having at least one congestion metric,
    assigning the set of nets a set of utilization metrics based on the set of congestion metrics, each net having at least one utilization metric;
    determining a set of sparse nets from the set of nets based on the set of utilization metrics;
    selecting one or more target nets from the set of sparse nets based on the set of timing margins;
    increasing, for the one or more target nets, at least one timing margin from the set of timing margins by modifying a wire code of the one or more target nets; and
    storing the wire code of the one or more target nets in the memory.

2. The method of claim 1, wherein the at least one utilization metric of each net is a largest of the at least one congestion metric from the traversed at least one routing tile.

3. The method of claim 1, wherein the utilization metric of each net in the set of sparse nets is below a utilization threshold value.

4. The method of claim 1, wherein the timing margin of the selected one or more target nets is below a timing margin threshold value.

5. The method of claim 1, wherein a first sparse net with a first timing margin and a second sparse net with a second timing margin traverse a first routing tile, wherein the first timing margin is smaller than the second timing margin, and wherein the first sparse net is selected to the one or more target nets and the second sparse net is not selected to the one or more target nets.

6. The method of claim 5, wherein the first sparse net has a first utilization metric based on the at least one congestion metric of the first routing tile from the set of routing tiles, and wherein the second sparse net has a second utilization metric based on the at least one congestion metric of the first routing tile from the set of routing tiles.

7. The method of claim 1, wherein the modified wire code indicates increased isolation of the one or more target nets.

8. The method of claim 1, further comprising:
    assigning the set of nets an updated utilization metric in response to the modified wire code;
    updating the set of sparse nets based on the updated utilization metrics;
    selecting one or more second target nets from the updated set of sparse nets; and
    increasing, for the one or more second target nets, at least one timing margin from the set of timing margins by modifying a wire code of the second one or more target nets; and
    storing the wire code of the second one or more target nets in the memory.

9. The method of claim 1, wherein each target net has a wire code.

10. The method of claim 1, wherein the modified wire code indicates extra wide metal for the one or more target nets.

11. A system for analyzing an integrated circuit design arranged into a grid of routing tiles, the system comprising:
    a processor; and
    a memory communicatively coupled with the processor, wherein the memory is encoded within instructions that when executed by the processor perform operations comprising:
        accessing memory for a netlist of the integrated circuit design,
        identifying a set of nets that traverse a set of routing tiles of the integrated circuit design, each net traversing at least one routing tile identifying a set of timing margins for the set of nets, each net having at least one timing margin;
        identifying a set of congestion metrics for the set of routing tiles, each routing tile having at least one congestion metric,
        assigning the set of nets a set of utilization metrics based on the set of congestion metrics, each net having at least one utilization metric;
        determining a set of sparse nets from the set of nets based on the set of utilization metrics;
        selecting one or more target nets from the set of sparse nets based on the set of timing margins;
        increasing, for the one or more target nets, at least one timing margin from the set of timing margins by modifying a wire code of the one or more target nets; and
        storing the wire code of the one or more target nets in the memory.

12. The system of claim 11, wherein the at least one utilization metric of each net is a largest of the at least one congestion metric from the traversed at least one routing tile.

13. The system of claim 11, wherein the utilization metric of each net in the set of sparse nets is below a utilization threshold value.

14. The system of claim 11, wherein the timing margin of the selected one or more target nets is below a timing margin threshold value.

15. The system of claim 11, wherein a first sparse net with a first timing margin and a second sparse net with a second timing margin traverse a first routing tile, wherein the first timing margin is smaller than the second timing margin, and wherein the first sparse net is selected to the one or more target nets and the second sparse net is not selected to the one or more target nets.

16. The system of claim 15, wherein the first sparse net has a first utilization metric based on the at least one congestion metric of the first routing tile from the set of routing tiles, and wherein the second sparse net has a second utilization metric based on the at least one congestion metric of the first routing tile from the set of routing tiles.

17. The system of claim 11, wherein the modified wire code indicates increased isolation of the one or more target nets.

18. The system of claim 11, wherein each target net has a wire code.

19. The system of claim 11, wherein the modified wire code indicates extra wide metal for the one or more target nets.

20. A computer-readable storage medium encoded with instructions for analyzing an integrated circuit design arranged into a grid of routing tiles, wherein the computer readable storage medium is not a transitory signal per se, the instructions executable by a processor to cause the processor to perform a method comprising:
  accessing memory for a netlist of the integrated circuit design;
  identifying a set of nets that traverse a set of routing tiles of the integrated circuit design, each net traversing at least one routing tile;
  identifying a set of timing margins for the set of nets, each net having at least one timing margin;
  identifying a set of congestion metrics for the set of routing tiles, each routing tile having at least one congestion metric,
  assigning the set of nets a set of utilization metrics based on the set of congestion metrics, each net having at least one utilization metric;
  determining a set of sparse nets from the set of nets based on the set of utilization metrics; of
  selecting one or more target nets from the set of sparse nets based on the set of timing margins;
  increasing, for the one or more target nets, at least one timing margin from the set of timing margins by modifying a wire code of the one or more target nets; and
  storing the wire code of the one or more target nets in the memory.

* * * * *